US010133830B2

(12) United States Patent
Bhatawadekar et al.

(10) Patent No.: US 10,133,830 B2
(45) Date of Patent: Nov. 20, 2018

(54) SCALING IN A MULTI-DIMENSIONAL BUILDING MODEL

(71) Applicant: HOVER INC., San Francisco, CA (US)

(72) Inventors: Vineet Bhatawadekar, Mountain View, CA (US); Shaohui Sun, Mountain View, CA (US); Ioannis Pavlidis, Redwood City, CA (US); Adam J. Altman, San Francisco, CA (US)

(73) Assignee: HOVER INC., San Francisco, CA (US)

( * ) Notice: Subject to any disclaimer, the term of this patent is extended or adjusted under 35 U.S.C. 154(b) by 187 days.

(21) Appl. No.: 15/011,126

(22) Filed: Jan. 29, 2016

(65) Prior Publication Data

US 2016/0224696 A1 Aug. 4, 2016

Related U.S. Application Data

(60) Provisional application No. 62/110,420, filed on Jan. 30, 2015.

(51) Int. Cl.
*G06F 17/50* (2006.01)
(52) U.S. Cl.
CPC .................. *G06F 17/5004* (2013.01)
(58) Field of Classification Search
CPC ................................ G06F 17/5004
See application file for complete search history.

(56) References Cited

U.S. PATENT DOCUMENTS

| | | | |
|---|---|---|---|
| 5,973,697 A | 10/1999 | Berry et al. | |
| 7,218,318 B2 | 5/2007 | Shimazu | |
| 7,814,436 B2 | 10/2010 | Schrag et al. | |
| 8,040,343 B2 | 10/2011 | Kikuchi et al. | |
| 8,098,899 B2 | 1/2012 | Ohashi | |
| 8,139,111 B2 | 3/2012 | Oldroyd | |
| 8,339,394 B1 | 12/2012 | Lininger | |
| 8,350,850 B2 | 1/2013 | Steedly et al. | |
| 8,390,617 B1 | 3/2013 | Reinhardt | |
| 2003/0014224 A1 | 1/2003 | Guo et al. | |

(Continued)

FOREIGN PATENT DOCUMENTS

| | | |
|---|---|---|
| WO | WO2007147830 A1 | 12/2007 |
| WO | WO2011079241 A1 | 6/2011 |
| WO | WO2011091552 A1 | 8/2011 |

OTHER PUBLICATIONS

Murillo et al., "Visual Door Detection Integrating Appearance and Shape Cues", Jun. 2008, Elsevier: Robotics and Autonomous Systems, vol. 56, No. 6, pp. 512-521.*

(Continued)

*Primary Examiner* — Abderrahim Merouan
*Assistant Examiner* — Jonathan M Cofino
(74) *Attorney, Agent, or Firm* — Garlick & Markison; Randy W. Lacasse

(57) ABSTRACT

A system and method is provided for scaling and constructing a multi-dimensional (e.g., 3D) building model using ground-level imagery. Ground-level imagery is used to identify architectural elements that have known architectural standard dimensional ratios. Dimensional ratios of architectural elements in the multi-dimensional building model (unscaled) are compared with known architectural standard dimensional ratios to scale and construct an accurate multi-dimensional building model.

16 Claims, 7 Drawing Sheets

(56) References Cited

U.S. PATENT DOCUMENTS

| | | | |
|---|---|---|---|
| 2004/0146197 A1* | 7/2004 | Piponi | G06T 13/80 382/154 |
| 2004/0196282 A1 | 10/2004 | Oh | |
| 2005/0265630 A1* | 12/2005 | Fukuhara | G06T 3/0018 382/276 |
| 2007/0168153 A1 | 7/2007 | Minor et al. | |
| 2008/0221843 A1 | 9/2008 | Shenkar et al. | |
| 2010/0045869 A1 | 2/2010 | Baseley et al. | |
| 2010/0074532 A1 | 3/2010 | Gordon et al. | |
| 2010/0202682 A1* | 8/2010 | Lieckfeldt | G06T 15/04 382/162 |
| 2011/0029897 A1 | 2/2011 | Russell | |
| 2011/0181589 A1 | 7/2011 | Quan et al. | |
| 2012/0224770 A1* | 9/2012 | Strassenburg-Kleciak | G06K 9/00624 382/165 |
| 2015/0261803 A1* | 9/2015 | Song | G06K 9/4671 707/797 |

OTHER PUBLICATIONS

Abdul Hasanulhakeem1; A tool to measure dimensions of buildings in various scales for Google Earth Plug-ins and 3D maps; Aug. 6, 2010; pp. 1-2 downloaded from internet: [https://groups.google.com/forum/#!topic/google-earth-browser-plugin/frlvZQ-m38I].

Bansal, et al., "Geo-Localization of Street Views with Aerial Image Databases," Nov. 28-Dec. 1, 2011, pp. 1125-1128.

Becker, et al., "Semiautomatic 3-D model extraction from uncalibrated 2-D camera views," MIT Media Laboratory, 15 pages.

Caramba App Development, "EasyMeasure—Measure with your Camera! on the App Store on iTunes", https://itunes.apple.com/us/app/easymeasure-measure-measure-your-camera!/id349530105?mt=8, 2 pages.

Chen, et al., "City-Scale Landmark Identification on Mobile Devices," pp. 737-744.

Fairfax County Virginia, "Virtual Fairfax," http://www.fairfaxcounty.gov/gis/virtualfairfax, 2 pages.

Fruh and Zakhor, "Constructing 3D City Models by Merging Aerial and Ground Views," IEEE Computer Graphics and Applications, Nov./Dec. 2003, pp. 52-61, 10 pages.

Huang and Wu, et al., "Towards 3D City Modeling through Combining Ground Level Panoramic and Orthogonal Aerial Imagery," 2011 Workshop on Digital Media and Digital Content Management, pp. 66-71, 6 pages.

Jaynes, "View Alignment of Aerial and Terrestrial Imagery in Urban Environments," Springer-Verlag Berlin Heidelberg 1999, pp. 3-19, 17 pages.

Kroepfl, et al., "Efficiently Locating Photographs in Many Panoramas," Nov. 2-5, 2010, ACM GIS'10.

Lee, et al., "Automatic Integration of Facade Textures into 3D Building Models with a Projective Geometry Based Line Clustering," Eurographics 2002, vol. 2, No. 3, 10 pages.

Lee, et al., "Integrating Ground and Aerial Views for Urban Site Modeling," 6 pages.

Pu et al., "Automatic Extraction of Building Features From Terrestrial Laser Scanning," International Institute for Geo-information Science and Earth Observation, 5 pages.

Scale & Area Measurement; http://www.geog.ucsb.edu/~jeff/115a/lectures/scale_and_area_measurement.html, 8 pages.

Scope Technologies; Solutions; Mar. 4, 2014; pp. 1-2 downloaded from the internet: [http://www.myscopetech.com/solutions.php].

SketchUp Knowledge Base, Tape Measure Tool: Scaling an entire model, http://help.sketchup.com/en/article/95006, 2013 Trimble Navigation Limited, 2 pages.

Wang, et al.; Large-Scale Urban Modeling by Combining Ground Level Panoramic and Aerial Imagery; IEEE Third International Symposium on 3D Data Processing, Visualization, and Transmission; Jun. 14-16, 2006; pp. 806-813.

Xiao, et al., "Image-based Facade Modeling," ACM Transaction on Graphics (TOG), 2008, 10 pages.

\* cited by examiner

SCALING IN A MULTI-DIMENSIONAL BUILDING MODEL

CROSS REFERENCE TO RELATED PATENTS/PATENT APPLICATIONS

The present U.S. Utility Patent Application claims priority pursuant to 35 U.S.C. § 119(e) to U.S. Provisional Application No. 62/110,420, entitled "Scaling in a Multi-dimensional Building Model," filed Jan. 30, 2015, which is hereby incorporated herein by reference in its entirety and made part of the present U.S. Utility Patent Application for all purposes.

INCORPORATION BY REFERENCE

This application makes reference to the complete subject matter of U.S. Utility patent application Ser. No. 13/624,816 entitled "Three-Dimensional Map System" filed Nov. 21, 2012, now U.S. Pat. No. 8,878,865 and U.S. Utility patent application Ser. No. 12/265,656, entitled "Method and System for Geometry Extraction, 3D Visualization and Analysis Using Arbitrary Oblique Imagery" filed Nov. 5, 2008, now U.S. Pat. No. 8,422,825, both of which are incorporated herein by reference in their entirety.

BACKGROUND

Technical Field

The technology described herein relates generally to a system and method for accurately scaling a multi-dimensional (e.g., 3D) model, and in particular to a system and method for scaling and constructing a multi-dimensional model using known architectural standards.

Description of Related Art

Location-based technologies and mobile technologies are often considered the center of the technology revolution of this century. Essential to these technologies is a way to best present location-based information to devices, particularly mobile devices. The technology used to represent this information has traditionally been based on a two dimensional (2D) map. Some efforts have been made to generate three-dimensional (3D) maps of urban cities with accurate 3D textured models of the buildings via aerial imagery or specialized camera-equipped vehicles. However, these 3D maps have limited texture resolution, geometry quality, inaccurate scaling and are expensive, time consuming and difficult to update and provide no robust real-time image data analytics for various consumer and commercial use cases.

DETAILED DESCRIPTION

Figure 1:
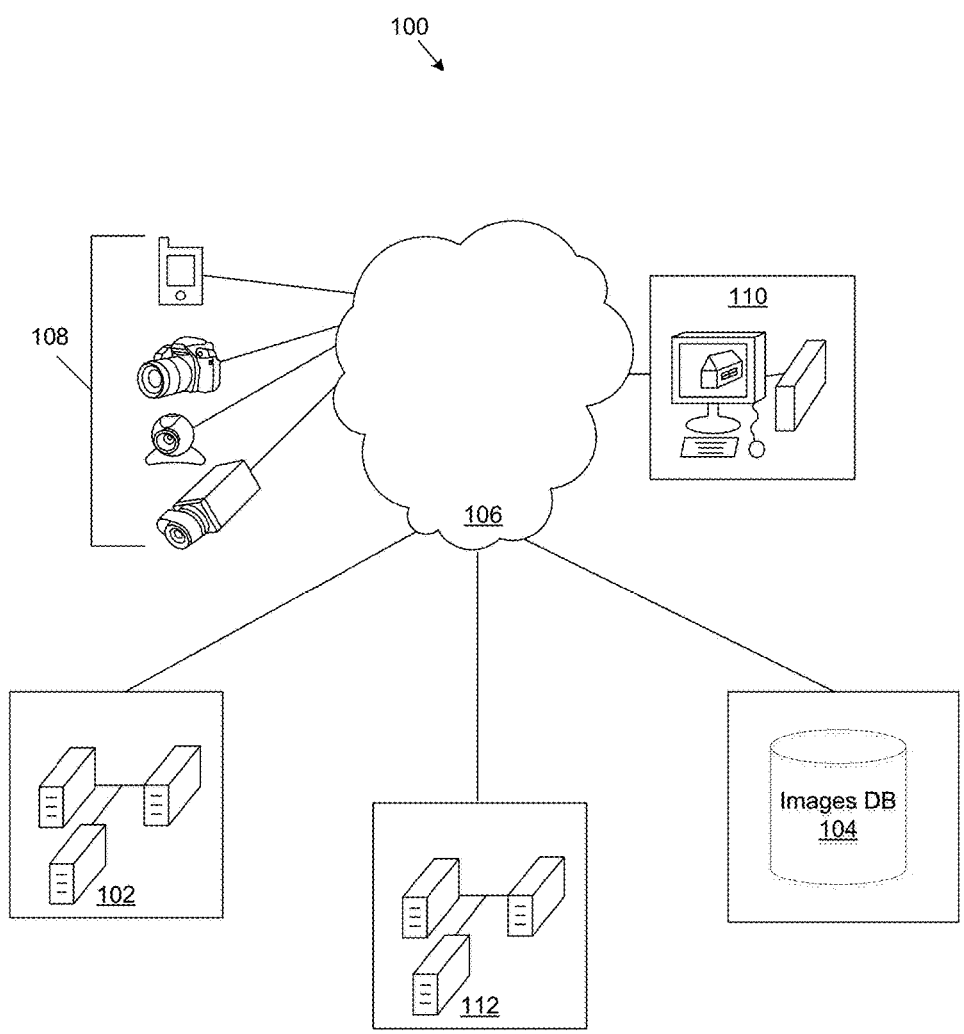
FIG. 1 illustrates one embodiment of a system architecture in accordance with the present disclosure.

FIG. 1 illustrates one embodiment of system architecture in accordance with the present disclosure. In one embodiment, image processing system 100 includes image processing servers 102. Image database (DB) 104 and image processing servers 102 are coupled via a network channel 106.

Network channel 106 is a system for communication. Network channel 106 includes, for example, an Ethernet or other wire-based network or a wireless NIC (WNIC) or wireless adapter for communicating with a wireless network, such as a WI-FI network. In other embodiments, network channel 106 includes any suitable network for any suitable communication interface. As an example and not by way of limitation, the network channel 106 can include an ad hoc network, a personal area network (PAN), a local area network (LAN), a wide area network (WAN), a metropolitan area network (MAN), or one or more portions of the Internet or a combination of two or more of these. One or more portions of one or more of these networks may be wired or wireless. As another example, network channel 106 can be a wireless PAN (WPAN) (such as, for example, a BLUETOOTH WPAN), a WI-FI network, a WI-MAX network, a 3G or 4G network, a cellular telephone network (such as, for example, a Global System for Mobile Communications (GSM) network).

In one embodiment, network channel 106 uses standard communications technologies and/or protocols. Thus, network channel 106 can include links using technologies such as Ethernet, 802.11, worldwide interoperability for microwave access (WiMAX), 3G, 4G, CDMA, digital subscriber line (DSL), etc. Similarly, networking protocols used on network channel 106 can include multiprotocol label switching (MPLS), transmission control protocol/Internet protocol (TCP/IP), User Datagram Protocol (UDP), hypertext transport protocol (HTTP), simple mail transfer protocol (SMTP), and file transfer protocol (FTP). In one embodiment, data exchanged over the network channel 106 is represented using technologies and/or formats including hypertext markup language (HTML) and extensible markup language (XML). In addition, all or some of links can be encrypted using conventional encryption technologies such as secure sockets layer (SSL), transport layer security (TLS), and Internet Protocol security (IPsec).

In one or more embodiments, image processing servers 102 include suitable hardware/software in the form of circuitry, logic gates, and/or code functions to process ground-level images to include, but not limited to, calculation of one or more image dimensions or ratios of dimensions according to one or more selected architectural elements of the image. Ground-level images include any images taken from a capture device operated at a distance from a façade. For example, but not limited to, ground level images may be captured by a person operating a digital camera device (e.g., smartphone) while circling a building. Capture device(s) 108 is in communication with image processing servers 102 for collecting images of building objects. Capture device(s) 108 are defined as electronic devices for capturing images. For example, the capture devices include, but are not limited to: a camera, a phone, a smartphone, a tablet, a video camera, a security camera, a closed-circuit television camera, a computer, a laptop, a webcam, wearable camera devices, photosensitive sensors, equivalents or any combination thereof.

Image processing system 100 also provides for viewer device 110 that is defined as a display device. For example, viewer device 110 can be a computer with a monitor, a laptop, a touch screen display, an LED array, a television set, a projector display, a wearable heads-up display of some sort, or any combination thereof. In one or more embodiments, the viewer device includes display of one or more building features such as facades and/or roofing elements. The façade elements include, but are not limited to, associated measurements, architectural elements and building material features. For example, a mobile device, a conventional desktop personal computer can have input devices such as a mouse, keyboard, joystick, touch screen, or other such input devices enabling the input of data and interaction with the displayed images and associated measurements.

In one embodiment, ground-level images of a physical building are uploaded to image processing system 100 from a capture device. An uploaded image is, for example, a digital photograph of a physical building showing all or a portion of a façade (side) or top of the physical building.

Image processing system 100 is used to generate accurately textured multi-dimensional building models (e.g., 2D/3D) based on the collected ground-level images. The textured, 2D/3D building models are generated using systems and methods, for example, as provided in U.S. Pat. No. 8,878,865 and U.S. Pat. No. 8,422,825, hereby incorporated by reference. While various embodiments are described using a 3D environment, a 2D environment can be used to implement the various embodiments of the present disclosure without departing from the scope thereof. In addition, third party sources of textured multi-dimensional building models can be substituted in the various embodiments described herein without departing from the scope of the technology described.

When building typical multi-dimensional building models, it is known to use geo-referenced imaging to calculate basic (with error) dimensional inputs. However, newer buildings or parts of building (e.g., additions), which have yet to been imaged by traditional orthogonal imagery methods (e.g., flyovers) used for geo-referencing, may result in 2D/3D building models that lack proper information for scaling (precise dimensions). Errors in dimensioning can be caused by visibility, resolution, obstructions, user error and capture device errors, etc.

It is known that some architectural elements used in the construction industry are standardized. For example, a standard US residential (exterior) door size can be 36"×80" with a width-to-height ratio of 9:20 and a height-to-width ratio of 20:9. In one or more embodiments of the technology described herein, a system and method is provided for calculating proper ratios of standard architectural elements (e.g., doors, windows, bricks, etc.) to determine scale and construct a textured multi-dimensional building model.

Images texturing a multi-dimensional building model are used to identify dimensional scale by comparing to known standard architectural element ratios. Once scale is identified, the textured models are constructed as accurately scaled multi-dimensional building models. It is understood that many architectural elements and their corresponding dimensions and ratios of dimensions exist and that the technology described herein is not limited to specific dimensions or ratios provided in example embodiments.

Figure 2:
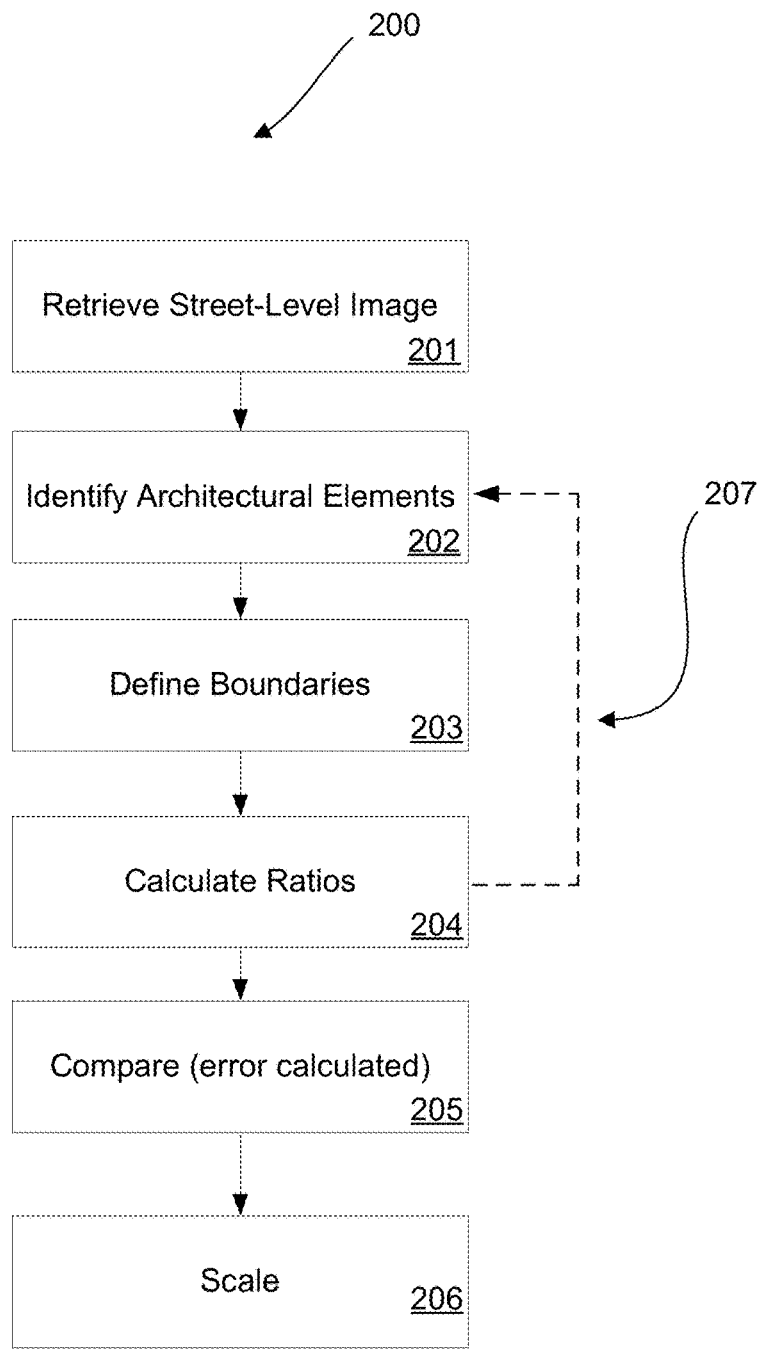
FIG. 2 illustrates a flowchart representing one embodiment of a process for accurately scaling a multi-dimensional building model in accordance with the present disclosure.
Figure 3:
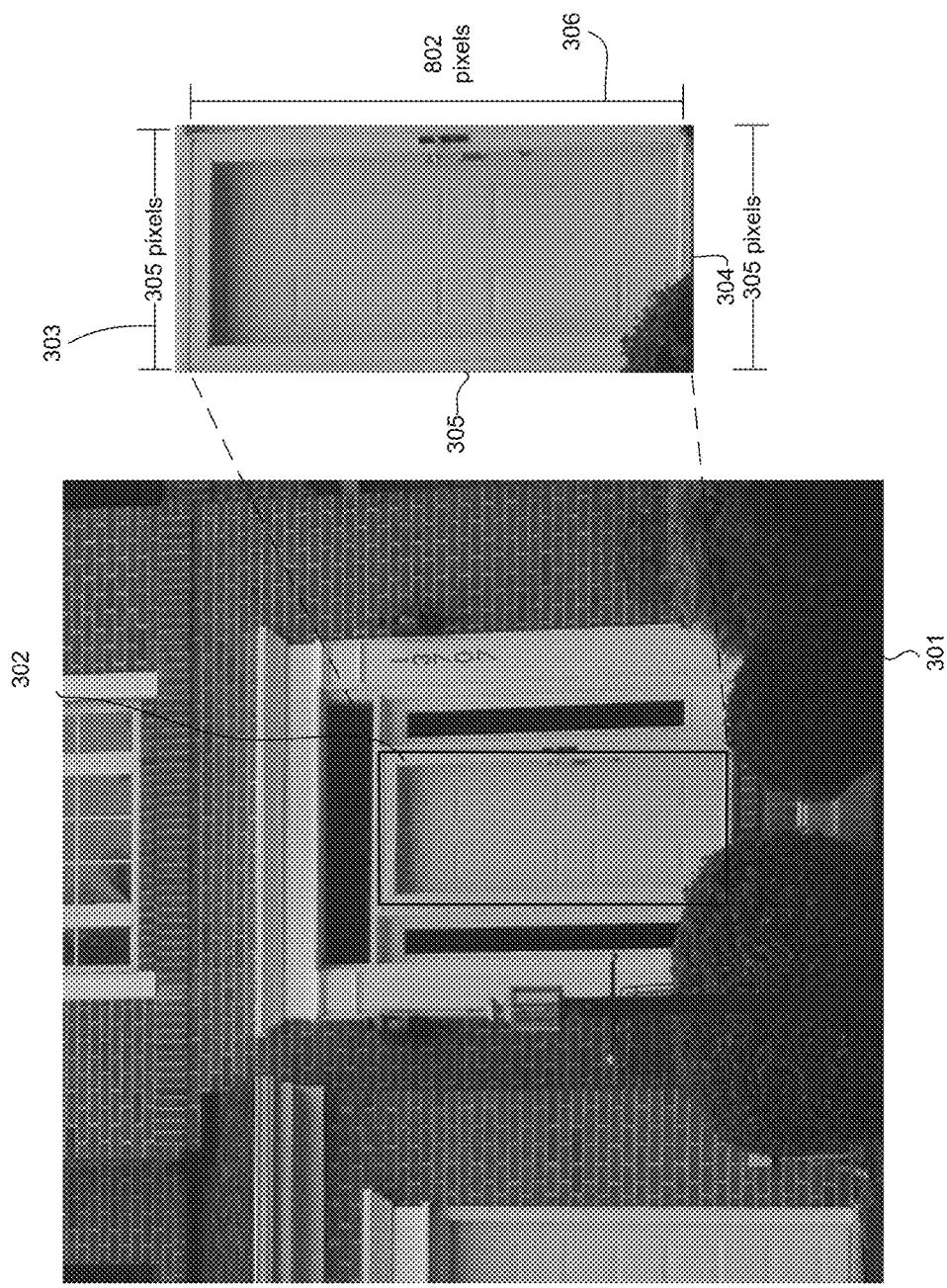
FIG. 3 illustrates an example embodiment for determining scale in a multi-dimensional building model using exterior front doors as an identified known architectural element in accordance with the present disclosure.

FIG. 2 illustrates a flowchart 200 representing one embodiment process for accurately scaling a textured multi-dimensional model during construction thereof in accordance with the present disclosure. In step 201, at least one ground-level image (imagery) is retrieved to potentially identify dimensions. In one embodiment, only a portion of the ground-level image is used since the entire image (façade) may not be needed. This portion, for example front façade, includes a cut-out of a full 2D image that has been rectified and correlated to vertices of geometric planes/polygons that make up a portion of, for example, a 3D model. For example, the portion may be a close up of the front porch of a house that includes the exterior front door (FIG. 3). In step 202, known architectural elements of the ground-level image are identified. In one embodiment, architectural elements are identified using known image or object recognition techniques, including known techniques, such as those shown in US references incorporated herein by reference. In alternative embodiments, the identification of architectural elements is accomplished using other approaches. For example, the perimeter boundaries are automatically identified using line detection techniques (e.g., frequency domain filtering). For another example, boundaries are identified using unique feature detection methods that look for repeated, consistent parallel lines or line intersections. For yet another example, boundaries for architectural elements are detected using unsupervised clustering algorithms based on learned, predictable patterns. For yet another example, boundaries can be manually marked up (e.g., by human observer).

In step 203, perimeter boundaries for the identified architectural element(s) are defined by correlating, for example, perimeter points, vertices, corner points, vertices, edges or corner pixels of the defined architectural element within the ground-based image to the corresponding boundaries (represented by x, y, z positions) within the 3D building model. Pixel positions are extrapolated from vertices/edges of the ground-level image.

In step 204, dimensional ratios of distances spanning the width and length of the identified architectural element are determined using image processing system 100 of FIG. 1. Since real-world positions (i.e., geo-references) of the vertices/edges of the ground-level image are not known, scale is determined by determining dimensional ratios (e.g., height-to-width, width-to-height or area (width×height)) within the defined image boundaries (e.g., identified front exterior door) in the ground-level image. And, in another embodiment, the process is repeated 207 to determine dimensional ratios for pluralities of determined image boundaries in one or more multiple architectural elements. In this embodiment, the resulting ratios are blended or averaged to determine a ratio. For example, ratios for multiple windows of apparent similar size can be calculated and then averaged.

In step 205, determined ratios are compared to known standard architectural element dimensional ratios (width-to-height, width-to-height or area). The comparison may be as simple as selecting a dimensional ratio which is closest to a known standard architectural dimensional ratio.

In an alternative embodiment, an error threshold accounts for inherent inaccuracy in the imagery and provides a likely range of values that are used to correlate a ratio value to known standard architectural element dimensional ratios. For example, if the known architectural standard ratio of width-to-height for an exterior front door is 9:20 (0.45), the threshold will be established using, for example, ±10% (0.045). If the determined ratio of the identified architectural element (door) falls within the range of 0.0405-0.0495, it is assumed that the determined ratio is likely to be the known architectural standard dimensional ratio for this door. If the determined ratio fails to fall within the threshold, it is assumed that it does not apply to the known architectural standard or it is from a different standard dimensional ratio for a different exterior front door size (e.g., 30×82 inches).

By selecting a dimensional ratio closest to the respective known architectural element dimensional ratios, a proper scale can be determined for the ground-level image based on relative error of the selected dimensional ratio to the known dimensional ratio of the known architectural element. This error is used to scale the multi-dimensional building model accordingly. For example, the error could be ±1%, etc.

Using the process described above (FIG. 2), a ground-level image is first used to identify an exterior front door as an architectural element (see FIG. 3). The four corners or vertices within a boundary of the identified exterior front door are determined. In one example embodiment four corner pixels or points are selected and their positions within the image mapped to the same points in the building model (e.g., represented in 3D space by x, y, z points). Then a ratio of the width to the height is determined by dividing the average height/width distances between the corners or vertices. In one embodiment, a number of pixels spanning the width is divided by a number of pixels spanning the height. The determined ratio, optionally including the ratio threshold error, is then compared to various known architectural standard ratios.

Figure 4:
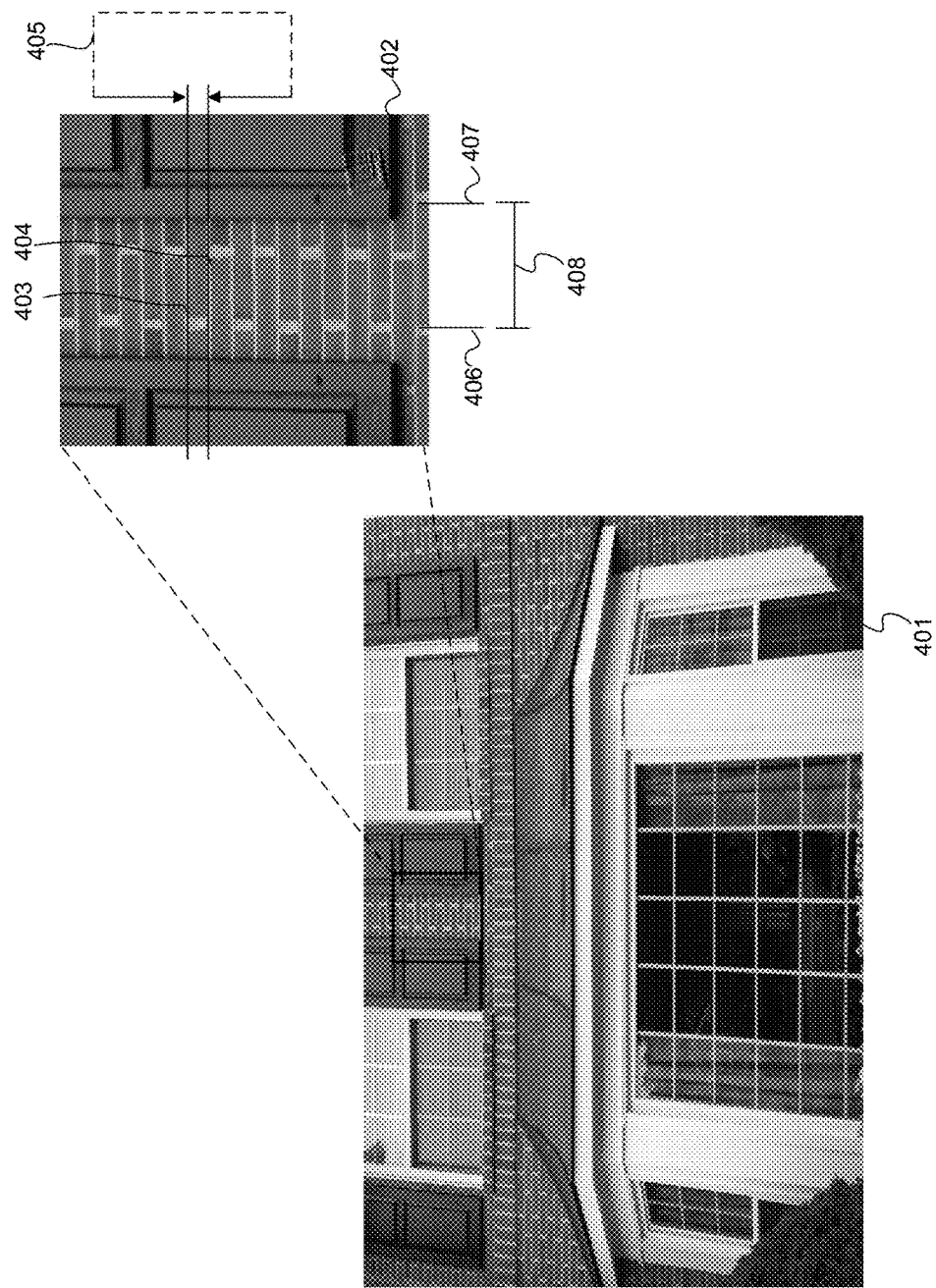
FIG. 4 illustrates another example embodiment for determining scale in a multi-dimensional building model using brick dimensions as an identified known architectural element in accordance with the present disclosure.

In yet another example embodiment, brick sizes are used as the known architectural standard dimensions (see FIG. 4). There are various sizes of bricks used in the construction industry (e.g., standard, modular, Norman, Roman, jumbo, etc.). A ratio of various sized bricks is used to extrapolate dimensions used to scale the image. For example, a typical brick's dimensions are 3½×2¼×8 (depth (D)×height (H)× length (L) in inches). However, it is understood by those skilled in the art that the technology described here includes, but is not limited to, other commonly used bricks dimensions listed in Table 1.

TABLE 1 brick types and standard dimensions.

| Brick Type | Actual Size<br>D × H × L (inches) |
|---|---|
| Modular | 3½ × 2¼ × 7½ |
| Norman | 3½ × 2¼ × 11½ |
| Roman | 3½ × 1¼ × 11½ |
| Jumbo | 3½ × 2½ × 8 |
| Economy | 3½ × 3½ × 7½ |
| Engineer | 3½ × 2¾ × 7½ |
| King | 3 × 2¾ × 9¾ |
| Queen | 3 × 2¾ × 8 |
| Utility | 3½ × 3½ × 11½ |

In a similar process to the previously discussed embodiment of using exterior front doors as the known architectural standard, a brick's height and length is used to identify dimensional ratios. Because bricks are smaller and a single image may contain many bricks, an average of a plurality of determined ratios may provide a higher accuracy. Therefore, pluralities of bricks are identified and their dimensional ratios determined. An average ratio is then compared to known brick architectural standard dimensional ratios. Error threshold values may be established for differing brick types and a comparison made between the average ratio value and the known architectural standard dimensional ratio, including the threshold. A brick's length-to-height or height-to-length ratio may be compared against known dimensional architectural standard ratios.

In step 206, the ratio which is closest to a known standard architectural element dimensional ratio is used to scale and construct a multi-dimensional (e.g., 2D/3D) building model. Using the exterior front door example, a ratio which matches a ratio of 9:20 reveals that the identified exterior front door is 36×80 inches. Once one or more actual dimensions are known in the retrieved ground-level image, the remaining images used during multi-dimensional model construction are scaled accordingly. In one embodiment, scale is determined for at least one image. In another embodiment, scale may be determined for each separate side (façade) or top of a building and each side scaled accordingly. In another embodiment, scale may be determined for each side (façade) or top of a building and an average scaling used. In another embodiment, multiple architectural elements are identified and ratios calculated with the closest (least error) ratio selected from a group of determined ratios. In another embodiment, an already constructed multi-dimensional model is scaled using one of the vertices as an anchor point. Once the edge has an accurate dimension (using the technology described herein), the vertex is anchored (i.e., anchored). The dimensions and position of the remaining vertices and edges are adjusted accordingly to maintain the original geometry (angles of the vertices) of the building model. In another embodiment, a centroid (the geometric center of the building model) is used as an anchor point and the dimensions of the vertices and edges are adjusted accordingly. Once a scaled building model has been constructed, the building model is textured based on the ground-level images with the original coordinates for textures.

FIG. 3 illustrates an example embodiment for scaling a multi-dimensional building model using an exterior door as the known architectural dimension in accordance with the present disclosure. Ground-level image 301 shows a front façade of a building object that includes door 302. The boundaries of the known architectural feature (i.e., the door) are determined and a dimensional ratio is extrapolated based on distances between door 302 boundaries. It is determined that top dimension 303 and bottom dimension 304 (width dimensions) of door 302 encompass a distance (e.g., could be a number of pixels, shown as 305, of a known resolution or any other known method of determining distance). Additionally, it is determined that left dimension 305 and right dimension 306 (height dimensions) encompass a distance (e.g., could be a number of pixels, shown as 802 pixels, of a known resolution or any other known method of determining distance). A ratio between the door width and height (e.g., 305/802) is used to identify error and determine the actual dimensions of the door. For example, a ratio of 305/802 (305:802) equates closely to a standard door ratio (3:8) from a door measuring 30×80 inches. As with the previous examples, the measurements ratios (width:height) are compared to existing known door dimensional ratios with optional error thresholds compared to identify a possible known standards match. FIG. 3 is used for diagrammatic purposes, specific positioning and designation of dimensions may change from image-to-image and distinct architectural feature. For example, the known door architectural standard may include or not include the door frame as shown. For example, when an external storm door is also included, in some embodiments, ratios will be calculated for the storm door only, the exterior front door or both.

FIG. 4 illustrates yet another example embodiment for determining scale in a multi-dimensional building model using a brick layout as the known architectural element in accordance with the present disclosure. Ground-level image 401 captures a façade of a building object showing exposed brick. In one embodiment, a portion of the façade is used to establish the top and bottom boundaries of a horizontal row of brick. Portion 402 shows an exposed brick façade with bricks in the traditional offset pattern. Top boundary 403, bottom boundary 404 (height 405) and length boundaries 408 (left and right edges (406/407)) are determined for one or more bricks (thereby identifying a boundary for one or more bricks). As with the door example, dimensional distances (e.g., ratios of pixels) within defined brick boundaries are compared to the known architectural standards for ratios for bricks dimensions (see Table 1) to determine actual dimensions (scale). For greater accuracy of multiple smaller dimensioned architectural features (e.g., bricks), averaging of ratios associated with a large number of the bricks will increase accuracy.

Figure 5:
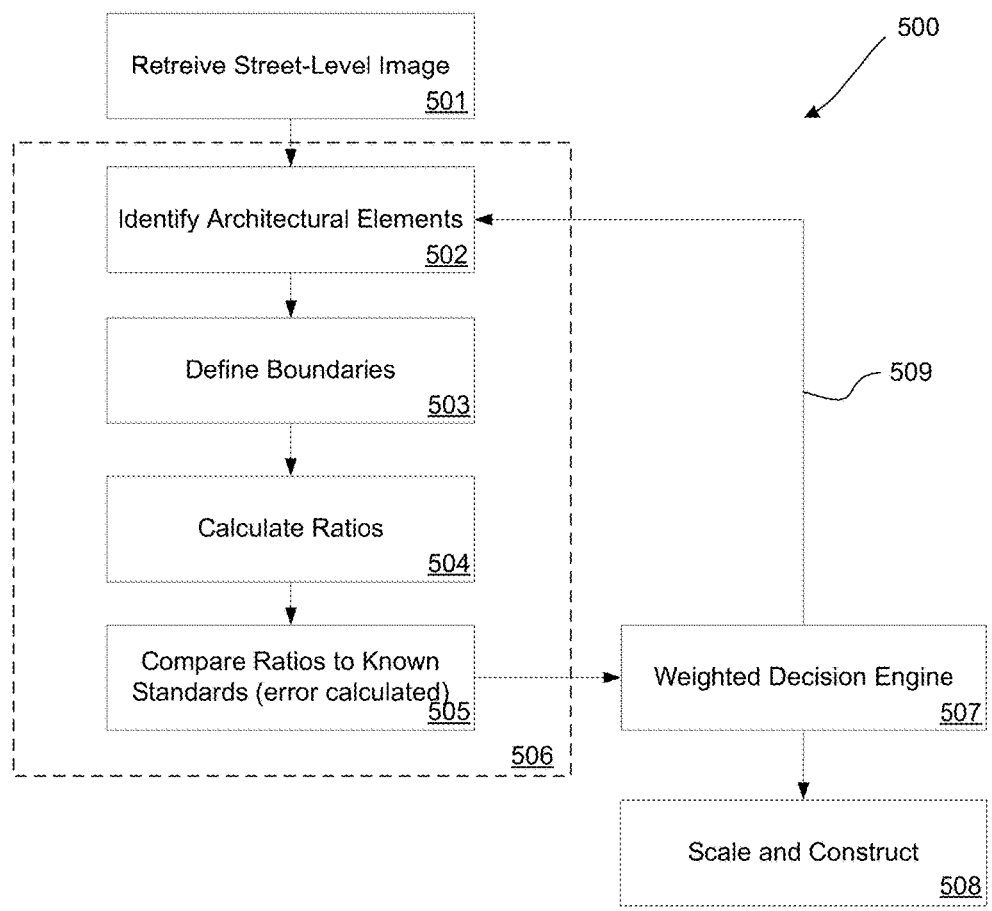
FIG. 5 illustrates an embodiment of a flowchart for improving accuracy of determining dimensional scale of a multi-dimensional building model in accordance with the present disclosure.

FIG. 5 illustrates an embodiment of a flowchart for improving the accuracy of determining dimensional scale of a multi-dimensional building model in accordance with the present disclosure. Process 500 includes identification of scale for a multi-dimensional building model by retrieving a ground-level image in step 501 that contains architectural elements (i.e., bricks, doors, windows, etc.) which are identified in step 502. In step 503, perimeter boundaries for the identified architectural element(s) are defined by correlating, for example, perimeter points, vertices, corner points, vertices or corner pixels of the defined architectural element within the ground-based image to the corresponding boundaries (represented by x, y, z positions) within the 3D building model and are used to determine dimensional ratios of the architectural elements in step 504. The ratios are compared to the known architectural element standard dimensional ratios to determine actual ratios in step 505. Steps 502 through 505 are repeatable 509 in an identification and ratio cycle 506.

In one embodiment, the repeated comparison between the ratios of multiple selections of an architectural element (e.g., door ratios in various doors located within the image) and the known architectural standard dimensions established in step 505 is fed into a weighted decision engine in step 507 to determine an average ratio determination. The weighted decision engine in step 507 uses learned statistical analysis to improve scaling over time and measurements. As more statistical information is accumulated (learned), the weighted decision engine creates a more predictable result. In step 508, the multi-dimensional building model is scaled and constructed according to the decision determined by the weighted decision engine in step 507 (e.g., ±error of selected dimensional ratio to selected known dimensional ratio of known architectural element).

Figure 6:
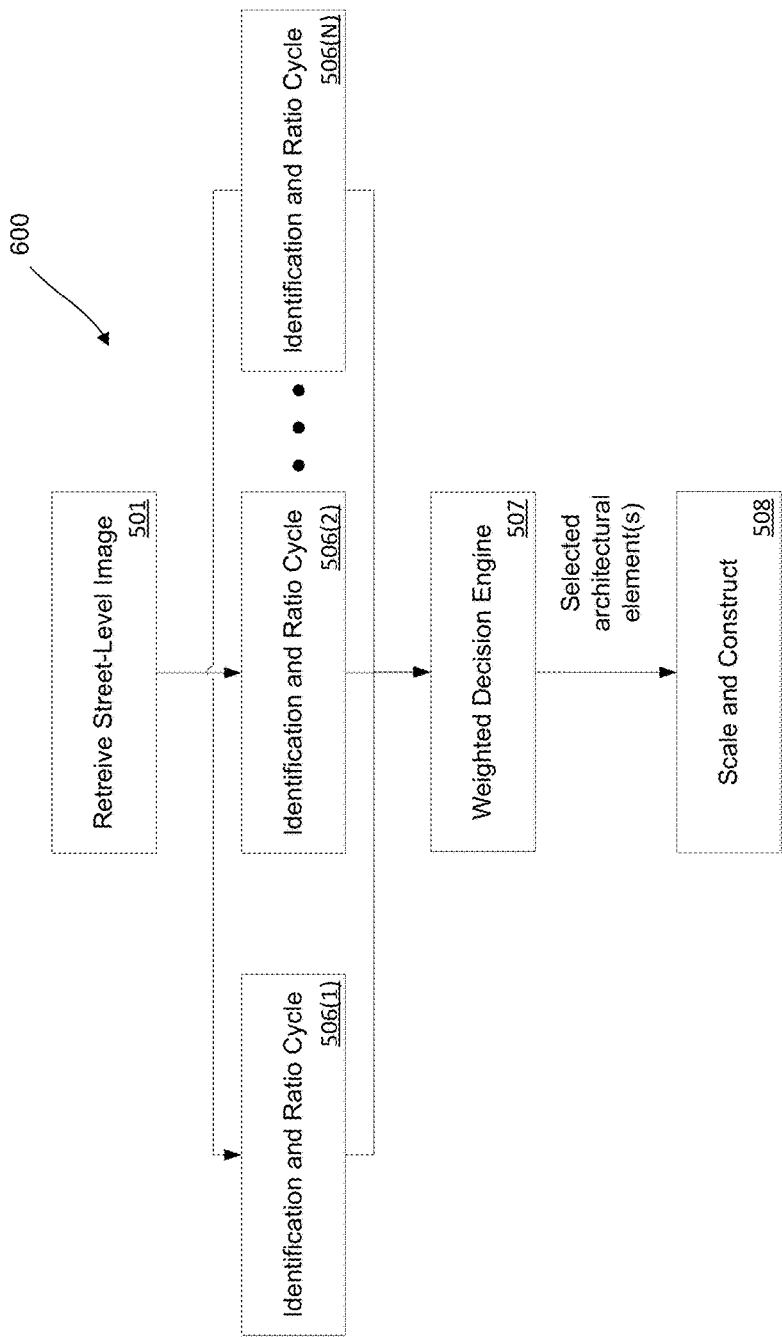
FIG. 6 illustrates an embodiment of a flowchart for weighing various known architectural elements to scale dimensions of a multi-dimensional building model in accordance with the present disclosure.

FIG. 6 illustrates an embodiment of a flowchart for weighing various known architectural elements to adjust scale in the dimensions of a multi-dimensional building model in accordance with the present disclosure. Process 600 includes identification of dimensional scale in a multi-dimensional building model by retrieving a ground-level image in step 501 that contain architectural elements. In one embodiment, the repeated identification and ratio cycle 506 is performed (506(1), 506(2) . . . 506(n)) for multiple architectural elements (e.g., brick (1), door (2), window (3), etc.) identified in the ground-level image retrieved in step 501. For example, if the retrieved ground-level image includes more than one architectural element (e.g., a brick façade and also showing the front door), identification and ratio cycle 506 (repeated for averaging) is performed for each architectural feature to determine which architectural feature(s) in weighted decision engine in step 507 would likely provide the most accurate, scaled multi-dimensional building model in step 508. For example, using ratios of the bricks may statistically prove a better gauge of scale.

In one embodiment, a weighted decision engine is provided to determine the architectural elements(s) that are most likely to produce an accurately scaled and reconstructed multi-dimensional building model based on using the least amount of processing or providing the fastest cycle times, or that prove more accurate over time. In addition, location of architectural elements may determine specific façade scaling. For example, if a door on the façade indicates an error (4%, too large) and bricks on a side façade indicate an error in width (3%, too narrow), the different facades could be scaled separately.

Throughout the specification, drawings and claims, the technology has been described primarily for scaling; however, the same technology and methodologies can be used to provide rescaling (e.g., a multi-dimensional model with poor (errors) original scaling, such as ortho-based) without departing from the scope of the technology described herein. In addition, the various embodiments may be interchangeably implemented before, during or after construction of the multi-dimensional model. In addition, all dimensions all shown in inches, may interchangeably use metric sizing. Also, known standard architectural dimensional ratios can be customized by geographic location. For example, a brick size may be different in Europe vs. the United States. And lastly, known standard architectural dimensional ratios can be selected from groups based on building style (Georgian, saltbox, colonial, etc.).

Figure 7:
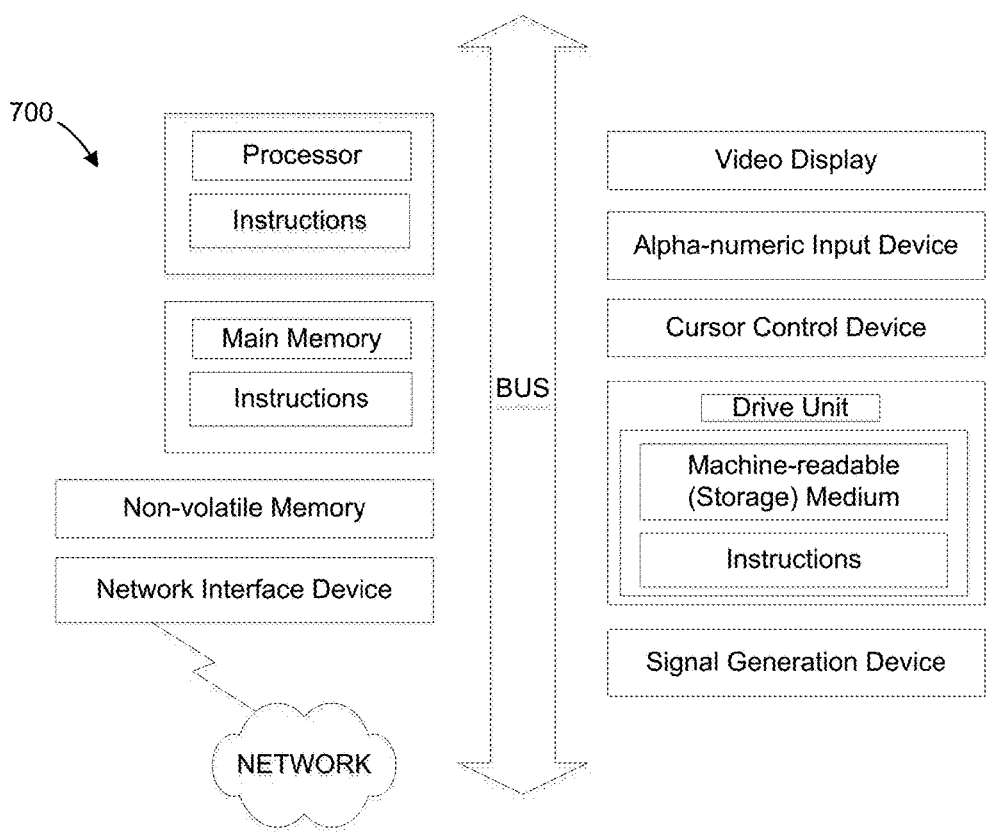
FIG. 7 illustrates a diagrammatic representation of a machine in the example form of a computer system in accordance with the present disclosure.

Referring now to FIG. 7, therein is shown a diagrammatic representation of a machine in the example form of a computer system 700 within which a set of instructions, for causing the machine to perform any one or more of the methodologies or modules discussed herein, may be executed. Computer system 700 includes a processor, memory, non-volatile memory, and an interface device. Various common components (e.g., cache memory) are omitted for illustrative simplicity. Computer system 700 is intended to illustrate a hardware device on which any of the components depicted in the example of FIG. 1 (and any other components described in this specification) can be implemented. Computer system 700 can be of any applicable known or convenient type. The components of computer system 700 can be coupled together via a bus or through some other known or convenient device.

This disclosure contemplates computer system 700 taking any suitable physical form. As example and not by way of limitation, computer system 700 may be an embedded computer system, a system-on-chip (SOC), a single-board computer system (SBC) (such as, for example, a computer-on-module (COM) or system-on-module (SOM)), a desktop computer system, a laptop or notebook computer system, an interactive kiosk, a mainframe, a mesh of computer systems, a mobile telephone, a personal digital assistant (PDA), a server, or a combination of two or more of these. Where appropriate, computer system 700 may include one or more computer systems 700; be unitary or distributed; span multiple locations; span multiple machines; or reside in a cloud, which may include one or more cloud components in one or more networks. Where appropriate, one or more computer systems 700 may perform without substantial spatial or temporal limitation one or more steps of one or more methods described or illustrated herein. As an example and not by way of limitation, one or more computer systems 700 may perform in real time or in batch mode one or more steps of one or more methods described or illustrated herein. One or more computer systems 700 may perform at different times or at different locations one or more steps of one or more methods described or illustrated herein, where appropriate.

The processor may be, for example, a conventional microprocessor such as an Intel Pentium microprocessor or Motorola power PC microprocessor. One of skill in the relevant art will recognize that the terms "machine-readable (storage) medium" or "computer-readable (storage) medium" include any type of device that is accessible by the processor.

The memory is coupled to the processor by, for example, a bus. The memory can include, by way of example but not limitation, random access memory (RAM), such as dynamic RAM (DRAM) and static RAM (SRAM). The memory can be local, remote, or distributed.

The bus also couples the processor to the non-volatile memory and drive unit. The non-volatile memory is often a magnetic floppy or hard disk, a magnetic-optical disk, an optical disk, a read-only memory (ROM), such as a CD-ROM, EPROM, or EEPROM, a magnetic or optical card, or another form of storage for large amounts of data. Some of this data is often written, by a direct memory access process, into memory during execution of software in the computer 700. The non-volatile storage can be local, remote, or distributed. The non-volatile memory is optional because systems can be created with all applicable data available in memory. A typical computer system will usually include at least a processor, memory, and a device (e.g., a bus) coupling the memory to the processor.

Software is typically stored in the non-volatile memory and/or the drive unit. Indeed, for large programs, it may not even be possible to store the entire program in the memory. Nevertheless, it should be understood that for software to run, if necessary, it is moved to a computer readable location appropriate for processing, and for illustrative purposes, that location is referred to as the memory in this document. Even when software is moved to the memory for execution, the processor will typically make use of hardware registers to store values associated with the software, and local cache that, ideally, serves to speed up execution. As used herein, a software program is assumed to be stored at any known or convenient location (from non-volatile storage to hardware registers) when the software program is referred to as "implemented in a computer-readable medium." A processor is considered to be "configured to execute a program" when at least one value associated with the program is stored in a register readable by the processor.

The bus also couples the processor to the network interface device. The interface can include one or more of a modem or network interface. It will be appreciated that a modem or network interface can be considered to be part of the computer system 700. The interface can include an analog modem, isdn modem, cable modem, token ring interface, satellite transmission interface (e.g., "direct PC"), or other interfaces for coupling a computer system to other computer systems. The interface can include one or more input and/or output devices. The I/O devices can include, by way of example but not limitation, a keyboard, a mouse or other pointing device, disk drives, printers, a scanner, and other input and/or output devices, including a display device. The display device can include, by way of example but not limitation, a cathode ray tube (CRT), liquid crystal display (LCD), or some other applicable known or convenient display device. For simplicity, it is assumed that controllers of any devices not depicted reside in the interface.

In operation, the computer system 700 can be controlled by operating system software that includes a file management system, such as a disk operating system. One example of operating system software with associated file management system software is the family of operating systems known as Windows® from Microsoft Corporation of Redmond, Wash., and their associated file management systems. Another example of operating system software with its associated file management system software is the Linux™ operating system and its associated file management system. The file management system is typically stored in the non-volatile memory and/or drive unit and causes the processor to execute the various acts required by the operating system to input and output data and to store data in the memory, including storing files on the non-volatile memory and/or drive unit.

The technology as described herein may have also been described, at least in part, in terms of one or more embodiments. An embodiment of the technology as described herein is used herein to illustrate an aspect thereof, a feature thereof, a concept thereof, and/or an example thereof. A physical embodiment of an apparatus, an article of manufacture, a machine, and/or of a process that embodies the technology described herein may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While particular combinations of various functions and features of the technology as described herein have been expressly described herein, other combinations of these features and functions are likewise possible. For example, the steps may be completed in varied sequences to complete the textured facades. The technology as described herein is not limited by the particular examples disclosed herein and expressly incorporates these other combinations.

What is claimed is:
1. A method of scaling a multi-dimensional building model comprises:
retrieving a digital ground-level image for the multi-dimensional building model, wherein the digital ground-level image has been rectified and correlated to vertices of geometric planes or polygons that make up a portion of the multi-dimensional building model;
identifying an architectural element within the digital ground-level image;
defining perimeter boundaries for the architectural element;
calculating a dimensional ratio of distances between the perimeter boundaries for the architectural element;
comparing the calculated dimensional ratio against one or more known dimensional ratios, within a threshold of error, of at least one similar architectural element, wherein the comparing further includes comparing and averaging a plurality of calculated dimensional ratios for differing sizes of the at least one similar architectural element;
selecting one of the one or more known dimensional ratios closest to the calculated dimensional ratio;
determining an actual scale of the digital ground-level image based on error between the calculated dimensional ratio and the selected one of the one or more known dimensional ratios; and
scaling the multi-dimensional building model accordingly with the actual scale.

2. The method of claim 1, wherein the perimeter boundaries are defined by any of: image pixels, vertices, edges or corner points.

3. The method of claim 1, wherein the scaling is performed while constructing the multi-dimensional building model.

4. The method of claim 1, wherein the perimeter boundaries are defined automatically or manually.

5. The method of claim 1, wherein the architectural element include: door(s), brick(s), window(s) or other architectural elements with architectural standard dimensional ratios.

6. The method of claim 1, wherein the retrieved digital ground-level image includes two or more architectural elements.

7. The method of claim 6, wherein the comparing further includes comparing against a plurality of dimensional ratios for the two or more architectural elements.

8. The method of claim 7, wherein the comparing further includes using a weighted decision to select a least error comparison evaluation for the two or more architectural elements.

9. The method of claim 1, wherein the dimensional ratios include any of: width-to-height, or height-to-width or area (width×height).

10. A method of scaling a multi-dimensional building model comprising:
    retrieving a digital ground-level image for the multi-dimensional building model, wherein the digital ground-level image has been rectified and correlated to vertices of geometric planes or polygons that make up a portion of the multi-dimensional building model;
    identifying a plurality of known architectural elements within the digital ground-level image;
    identifying perimeter boundaries for the plurality of known architectural elements identified within the digital ground-level image;
    calculating dimensional ratios within the identified perimeter boundaries of each of the plurality of known architectural elements;
    comparing each of the dimensional ratios against one or more known dimensional ratios, within a threshold of error, of at least one known similar architectural element, wherein the comparing further includes comparing and averaging a plurality of computed dimensional ratios for differing sizes of the at least one known similar architectural element;
    weighting the comparisons based on similarity of calculated dimensional ratios to their respective known architectural element dimensional ratios;
    selecting a dimensional ratio from the respective known architectural element dimensional ratios, wherein the selected dimensional ratio is closest to one of the calculated dimensional ratios;
    determining a scale of the digital ground-level image based on relative error of the selected dimensional ratio; and
    scaling the multi-dimensional building model with the determined scale.

11. The method of claim 10, wherein the scaling is performed while constructing the multi-dimensional building model.

12. The method of claim 10, wherein the at least one known architectural element includes: door(s), brick(s), or window(s).

13. The method of claim 10, wherein the retrieved ground-level image includes two or more known architectural elements.

14. The method of claim 13, wherein the known architectural elements are any of: similar or different.

15. The method of claim 10, wherein the dimensional ratios include any of: width-to-height, or height-to-width or area (width×height).

16. A computer-based system for scaling a multi-dimensional building model comprising:
    a computer processor with computing instructions to:
    retrieve a digital ground-level image for the multi-dimensional building model, wherein the digital ground-level image has been rectified and correlated to vertices of geometric planes or polygons that make up a portion of the multi-dimensional building model;
    identify a plurality of different known architectural elements within the digital ground-level image;
    identify perimeter boundaries for the plurality of different known architectural elements identified within the digital ground-level image;
    calculate dimensional ratios within the identified perimeter boundaries of each of the plurality of different known architectural elements;
    compare each of the dimensional ratios against one or more known dimensional ratios of at least one known similar architectural element;
    weight the comparisons based on similarity of calculated dimensional ratios to their respective known architectural element dimensional ratios;
    select a dimensional ratio from the respective known architectural element dimensional ratios, wherein the selected dimensional ratio is closest to one of the calculated dimensional ratios;
    determine a scale of the digital ground-level image based on relative error of the selected dimensional ratio; and
    scale the multi-dimensional building model with the determined scale.

* * * * *